United States Patent
Chen et al.

(10) Patent No.: US 8,269,408 B2
(45) Date of Patent: Sep. 18, 2012

(54) LED BASE STRUCTURE WITH EMBEDDED CAPACITOR

(75) Inventors: Ming-Hung Chen, Zhudong Town (TW); Shih-Yi Wen, Zhudong Town (TW); Jing-Yi Chen, Zhudong Town (TW)

(73) Assignee: Helio Optoelectronics Corporation, Zhudong Town, Hsinchu County (TW)

( * ) Notice: Subject to any disclaimer, the term of this patent is extended or adjusted under 35 U.S.C. 154(b) by 0 days.

(21) Appl. No.: 13/003,702

(22) PCT Filed: Aug. 12, 2008

(86) PCT No.: PCT/CN2008/001453
§ 371 (c)(1),
(2), (4) Date: Jan. 11, 2011

(87) PCT Pub. No.: WO2010/017655
PCT Pub. Date: Feb. 18, 2010

(65) Prior Publication Data
US 2011/0121723 A1    May 26, 2011

(51) Int. Cl.
*H01L 33/62* (2010.01)
*H01L 33/36* (2010.01)
*H01L 33/00* (2010.01)

(52) U.S. Cl. .......... 313/498; 313/500; 313/506; 257/91; 257/99

(58) Field of Classification Search .......... 313/498–512; 257/678–733, 81–100; 315/169.1–169.4
See application file for complete search history.

(56) References Cited

U.S. PATENT DOCUMENTS

| 7,264,381 | B2 | 9/2007 | Liu et al. | |
| 7,279,724 | B2* | 10/2007 | Collins et al. | 257/100 |
| 2002/0180063 | A1* | 12/2002 | Iwaki et al. | 257/724 |
| 2008/0061427 | A1 | 3/2008 | Chiang | |

FOREIGN PATENT DOCUMENTS

| CN | 1662130 A | 8/2005 |
| TW | 1287607 | 10/2007 |

OTHER PUBLICATIONS

International Search Report for PCT/CN2008/001453 dated Apr. 30, 2009.

* cited by examiner

*Primary Examiner* — Mariceli Santiago
(74) *Attorney, Agent, or Firm* — Stites & Harbison, PLLC; Juan Carlos A. Marquez, Esq (57) ABSTRACT

An LED base structure with an embedded capacitor includes a body, at least one pair of metal layers, at least one dielectric layer, and at least two conductive channels. The body is an insulating base. The metal layers are disposed in the body, and the dielectric layer is disposed between the metal layers, so as to form an embedded capacitor. The conductive channels are electrically connected to the metal layers, respectively. The LED base structure is further electrically connected to a resistor for forming a resistor-capacitor delay circuit whereby a phase delay is effectuated whenever AC power is supplied to the LED base structure, so as to control the time for switching on one of two parallel-connected LEDs and, as a result, prevent the LEDs from flashing which might otherwise arise when the LEDs are supplied with AC power.

4 Claims, 6 Drawing Sheets

LED BASE STRUCTURE WITH EMBEDDED CAPACITOR

CROSS-REFERENCE TO RELATED APPLICATIONS

This application is a 35 USC 371 application of PCT/CN2008/001453 filed on Aug. 12, 2008, published as Pub. No. WO2010/017655. The content of the specification is incorporated herein by reference.

BACKGROUND OF THE INVENTION

1. Technical Field

The present invention relates to light-emitting diode (LED) base structures each with an embedded capacitor, and more particularly, to an LED base structure equipped with an embedded capacitor and configured to use alternating current (AC) as a power source.

2. Description of Related Art

Development of light-emitting diode (LED) technology is swift and sophisticated. Also, LEDs have advantages, such as low volume, low power consumption, high reaction rate, long service life, and high vibration resistance. Hence, LEDs are gradually replacing traditional halogen lamps and fluorescent tubes and therefore have obviously become a new light source for use with future lighting devices.

LEDs are designed to glow when forward biased (electrically connected). In the situation where LEDs are driven by alternating current (AC) grid power, the LEDs give off light in intermittent bursts due to the periodicity of AC power. As a result, LEDs have rather limited application. At present, LEDs are powered mostly by direct current (DC) power sources.

Taiwan Patent No. I287607, entitled AC-powered LED Lighting Device and Light-emitting Unit of the Same, discloses an LED lighting device that uses AC power as a source of power supply, wherein the AC power has a forward voltage and a reverse voltage. The LED lighting device comprises a light-emitting unit. The light-emitting unit comprises a first LED chip and a second LED chip. The LED chips are connected in parallel and are electrically conductive in opposite directions. The forward voltage enables the first LED chip to be electrically conductive. The reverse voltage enables the second LED chip to be electrically conductive.

According to the aforesaid prior art, the two LED chips are connected in parallel and are electrically conductive in opposite directions. Hence, the two LED chips take turns giving off light when supplied with the AC power. Accordingly, the two LED chips can operate on AC power.

Figure 1A:
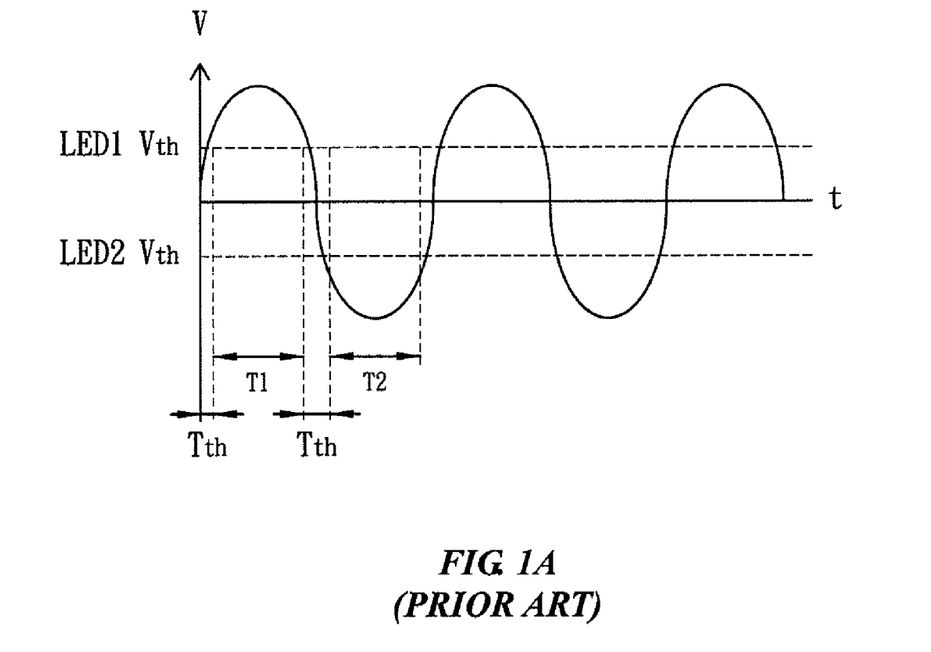
FIG. 1A is a graph of threshold voltage against AC current when AC current is supplied to a conventional light-emitting diode (LED) base structure.

Referring to FIG. 1A, there is shown a graph of threshold voltage Vth against AC current when AC current is supplied to a conventional light-emitting diode (LED) base structure. To enable an LED to operate and give off light, it is necessary that the level of the voltage driving the LED is higher than the threshold voltage Vth of the LED. Hence, it takes a waiting period Tth for the driving voltage level to rise to the threshold voltage Vth in order to switch the voltage of AC power from one polarity to the other polarity and therefore enable the LED to give off light.

Figure 1B:
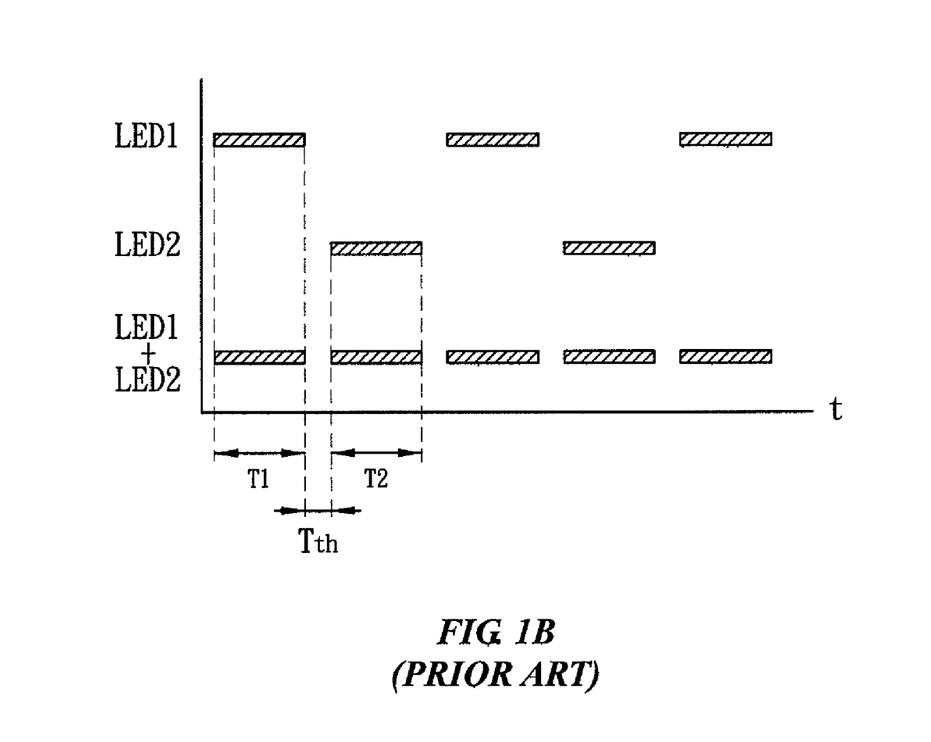
FIG. 1B is a sequence diagram of light emitted from an LED when AC current is supplied to the conventional LED base structure.

Referring to FIG. 1B, there is shown a sequence diagram of light emitted from an LED when AC current is supplied to the conventional LED base structure. A waiting period Tth intervenes between light emission periods T1, T2 of two light-emitting diodes LED1, LED2 in operation. Hence, if the light-emitting diodes LED1, LED2 take turns giving off light, the light emitted is intermittent and thus is flashing. As a result, the light-emitting diodes LED1, LED2 have rather limited application in an AC power environment.

Therefore, the conventional LED base structure is inconvenient and defective in terms of structure and use and thus has room for improvement. To solve the aforesaid problems, related manufacturers endeavor to find a solution. However, on the one hand, applicable designs have hitherto not been developed and finalized. On the other hand, general products lack an appropriate structure required for solving the aforesaid problems. Accordingly, it is imperative to develop a novel LED base structure with an embedded capacitor, which is not only an important R&D topic, but also a target which calls for urgent improvement to be made by the industrial sector.

In view of the existing drawbacks of the conventional LED base structure, the inventor of the present invention studied the conventional LED base structure with a view to making innovative improvement therein according to the inventor's years of experience and expertise of designing and manufacturing this product and by application of related theories, so as to develop a novel LED base structure with an embedded capacitor and thereby improve on the conventional LED base structure and render it more practical. Through continuous research, design, repeated trial production of samples and modification thereof, the inventor eventually created the present invention of high practicability.

SUMMARY OF THE INVENTION

It is an objective of the present invention to overcome the existing drawbacks of a conventional light-emitting diode (LED) base structure by providing a novel LED base structure with an embedded capacitor. The technical issue to be addressed by the present invention involves embedding two metal layers inside the body of an LED and forming a dielectric layer therein so as to form an embedded capacitor, couple together the embedded capacitor and an external resistor, and form a resistor-capacitor delay circuit. If a plurality of LEDs are coupled to an LED base structure and supplied with AC power, the known problem with LEDs flashing arising from alteration of polarity of voltage of AC power can be eliminated when the time of switching on the LEDs is controlled by the delay circuit.

The objectives to be achieved, and technical problems to be solved, by the present invention are implemented by the technical solution described hereunder. The present invention provides an LED base structure with an embedded capacitor, characterized in that the LED base structure comprises: a body being an insulating base; at least one pair of metal layers disposed in the body; at least one dielectric layer disposed between paired said metal layers; and at least two conductive channels electrically connected to the metal layers, respectively.

The objectives to be achieved, and technical problems to be solved, by the present invention are further implemented by taking the technical measures described hereunder.

The body of the LED base structure with an embedded capacitor comprises a plurality of ceramic layers stacked up.

The body of the LED base structure with an embedded capacitor has a recess.

The body of the LED base structure with an embedded capacitor is made of aluminum monoxide, quartz, silicon dioxide, calcium zirconate, or glass ceramic.

The dielectric layer of the LED base structure with an embedded capacitor is made of silicon dioxide, barium titanate, or a ceramic layer.

The LED base structure with an embedded capacitor further comprises at least one pair of electrodes. A first end portion of each of the electrodes is exposed from the bottom side of the recess of the body. A second end portion of each of the electrodes is embedded in the body. The second end portion is electrically connected to one of the conductive channels.

The present invention excels the prior art in advantages and beneficial effects. Given the aforesaid technical solution as disclosed in the present invention, the LED base structure with an embedded capacitor at least has the following advantages and beneficial effects:

1. The LED base structure has an embedded capacitor and thus need not be connected to an additional capacitive component.

2. The step of embedding a capacitor in the LED base structure is performed during the LED base structure fabrication process, thereby cutting costs and allowing capacitance to be designed as needed.

3. Due to its embedded capacitor, the LED base structure widens its application.

In conclusion, an LED base structure with an embedded capacitor, as disclosed in the present invention, comprises a body, at least one pair of metal layers, at least one dielectric layer, and at least two conductive channels. The body is an insulating base. The metal layers are disposed in the body, and the dielectric layer is disposed between the metal layers, so as to form an embedded capacitor. The conductive channels are electrically connected to the metal layers, respectively. The LED base structure is further electrically connected to a resistor for forming a resistor-capacitor delay circuit whereby a phase delay is effectuated whenever AC power is supplied to the LED base structure, so as to control the time for switching on one of two parallel-connected LEDs and, as a result, prevent the LEDs from flashing which might otherwise arise when the LEDs are supplied with AC power. The present invention has the aforesaid advantages and practical values, improves on the prior art in terms of product structure and function, makes significant progress in technology, manifests high performance and practicability, and demonstrates inventive and remarkable functionality. Accordingly, an LED base structure with an embedded capacitor according to the present invention has novelty, non-obviousness, and practicability.

BRIEF DESCRIPTION OF THE DRAWINGS

A detailed description of further features and advantages of the present invention is given below so that a person skilled in the art can understand and implement the technical contents of the present invention and readily comprehend the above and other objectives, features, and advantages thereof by reviewing the disclosure of the present specification and the appended claims in conjunction with the accompanying drawings, in which:

DETAILED DESCRIPTION OF THE INVENTION

To further describe the technical means adopted in the present invention to achieve the objectives of the present invention and the effects of the technical means adopted, the specific aspects of implementation, structure, features, and effects of a light-emitting diode (LED) base structure with an embedded capacitor put forth according to the present invention are illustrated in detail with a preferred embodiment and accompanying drawings hereunder.

The above and other technical contents, features, and effects of the present invention can be clearly presented in detail when described with a preferred embodiment and accompanying drawings hereunder. A description of the specific aspects of implementation of the present invention enables deeper thorough understanding of the technical means adopted in the present invention to achieve the objectives of the present invention and the effects of the technical means adopted. However, the accompanying drawings serve reference and illustrative purposes only, but are not intended to restrict the present invention.

Figure 2:
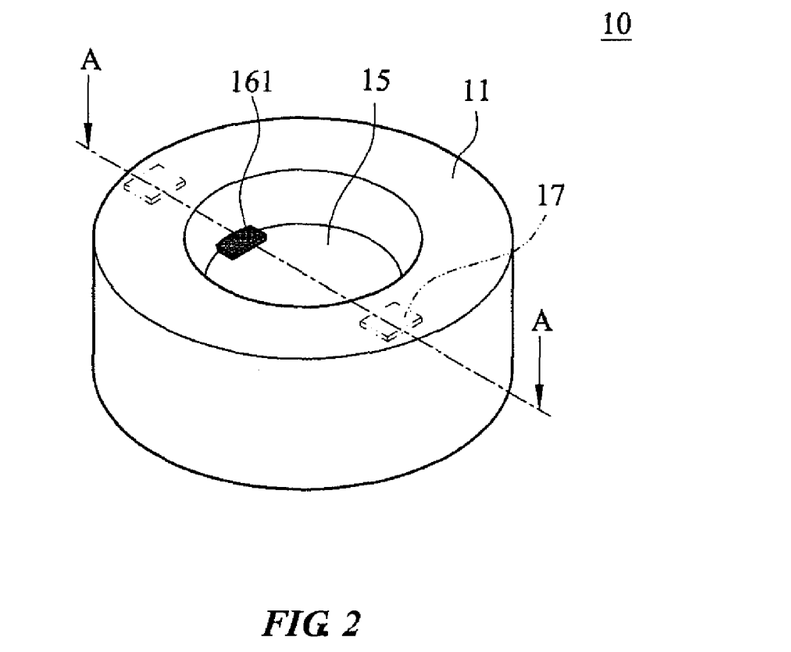
FIG. 2 is a schematic perspective view of an LED base structure with an embedded capacitor according to an embodiment of the present invention.
Figure 3:
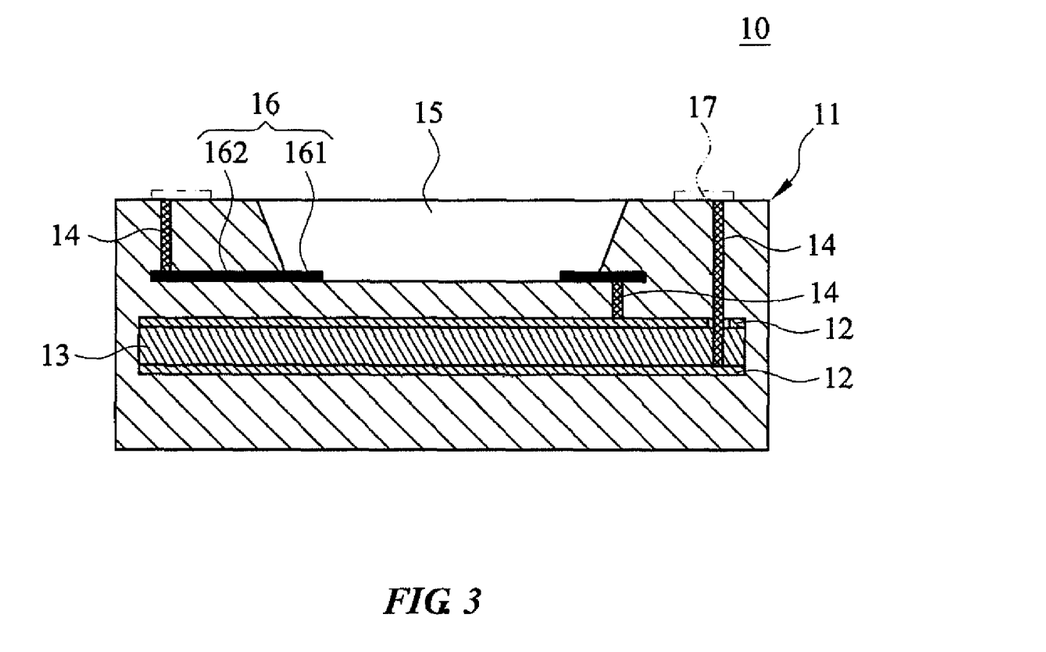
FIG. 3 is a cross-sectional view taken along line A-A in FIG. 2 according to an embodiment of the present invention.

Referring to FIGS. 2 and 3, in this embodiment, an light-emitting diode (LED) base structure 10 with an embedded capacitor Ci, comprising a body 11, at least one pair of metal layers 12, at least one dielectric layer 13, and at least two conductive channels 14.

The body 11 provides a package for the LED base structure 10 with the embedded capacitor Ci. The body 11 is an insulating base. In an aspect of implementation, the body 11 comprises a plurality of ceramic layers stacked up. The body 11 can also be made of aluminum monoxide, quartz, silicon dioxide, calcium zirconate, or glass ceramic.

In addition to a plurality of ceramic layers, the body 11 comprises therein the metal layers 12, the dielectric layer 13, and the conductive channels 14. A recess 15 functioning as a die bonding region is disposed in the body 11. Upon the coupling of the body 11 and a plurality of light-emitting diodes LED1, LED-2, LED3, LED-4, the recess 15 can receive the light-emitting diodes LED1, LED-2, LED3, LED-4.

Figure 4:
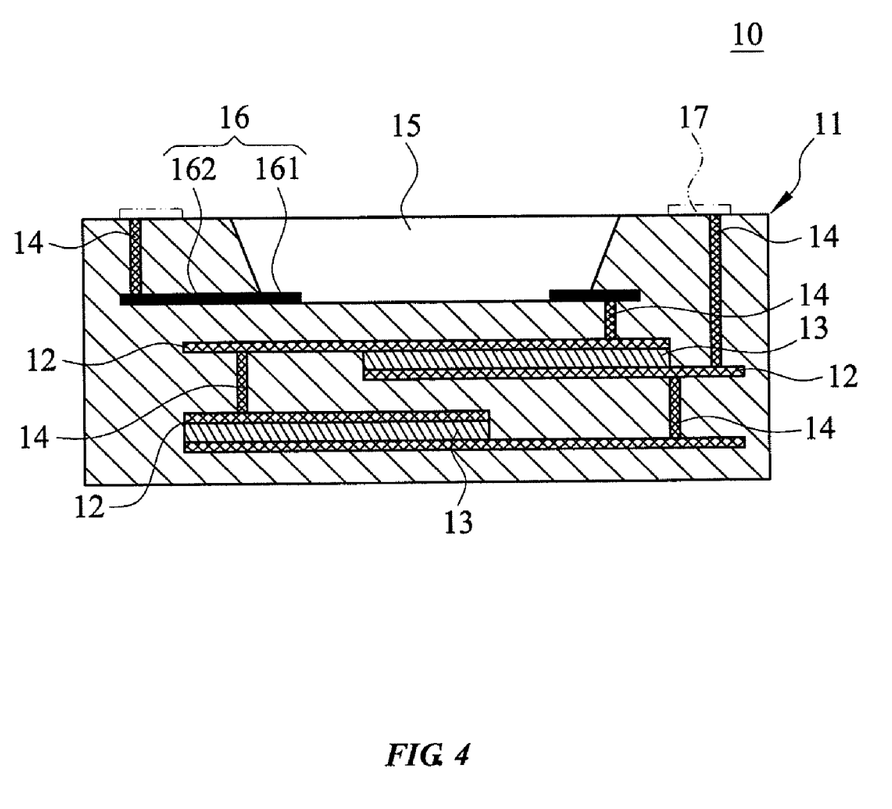
FIG. 4 is another cross-sectional view taken along line A-A in FIG. 2 according to an embodiment of the present invention.

Referring to FIG. 3 and FIG. 4, the metal layers 12 are embedded in the body 11, and the LED base structure 10 with the embedded capacitor Ci comprises one or two pairs of said metal layers 12. Each pair of said metal layers 12 is disposed at any position in the body 11. Each metal layer of said pair metal layers 12 is disposed upper and lower in parallel. If a plurality of ceramic layers is stacked up to form the body 11, it is feasible for the metal layers 12 to be easily positioned between the ceramic layers in sequence, so as to form the embedded capacitor Ci.

The dielectric layer 13 is disposed between each pair of said metal layers 12. After one or two pairs of said metal layers 12 have been embedded in the LED base structure 10 with the embedded capacitor Ci, the body 11 has therein one or two said dielectric layers 13 for providing electrical insulation between each said metal layer 12 of each pair of said metal layers 12. The dielectric layer 13 can be made of aluminum monoxide, quartz, silicon dioxide, calcium zirconate, or glass ceramic. In the situation where the dielectric layer 13 is disposed between two said metal layers 12, the embedded capacitor Ci characterized by a structure of metal layer 12-dielectric layer 13-metal layer 12 is disposed in the LED base structure. The efficiency of the fabrication process is enhanced when the dielectric layer and the body are made of the same material.

The conductive channels 14 are formed in the body 11 and electrically connected to the metal layers 12, respectively, to function as electrodes of the embedded capacitor Ci. In the situation where two said metal layers 12 are embedded in the LED base structure 10 with the embedded capacitor Ci, the body 11 can have therein at least two said conductive channels 14 electrically connected to the metal layers 12, respectively. Likewise, in the situation where two pairs of said metal layers 12 are embedded in the body 11, the body 11 can have therein at least four said conductive channels 14 electrically connected to the metal layers 12, respectively. With the body 11 having therein at least one said embedded capacitor Ci, the conductive channels 14 are connected in parallel or in series for regulating and controlling the total capacitance level.

The capacitance of the embedded capacitor Ci can be calculated, using the equation below:

$$C = (\in_0 \times A)/D$$

wherein capacitance of the embedded capacitor Ci is denoted by C, vacuum permittivity by $\in_0$, area of each of the metal layers 12 by A, and distance between two said metal layers 12 by D. For example, the closer are the two metal layers 12 or the larger are the area of the two metal layers 12, the more is the charge accumulated, and thus the larger is the capacitance produced by the embedded capacitor Ci. Conversely, the larger is the distance between the two metal layers 12 or the smaller is the area of the two metal layers 12, the less is the charge accumulated, and thus the less is the capacitance produced by the embedded capacitor Ci.

The LED base structure 10 with the embedded capacitor Ci further comprises at least one pair of electrodes 16. Each of two said electrodes 16 has a first end portion 161 and a second end portion 162. Each of the first end portions 161 is exposed from the bottom side of the recess 15 of the body 11 for use in wire bonding. Each of the second end portions 162 is embedded in the body 11. One of the second end portions 162 is electrically connected to one of the metal layers 12 in the embedded capacitor Ci via one of the conductive channels 14. One of the conductive channels 14 is connected to an external power source, that is, an electrode 17, for supplying power to the LED base structure 10 with the embedded capacitor Ci.

The functions and effects of this embodiment are illustrated with the following application example.

Figure 5A:
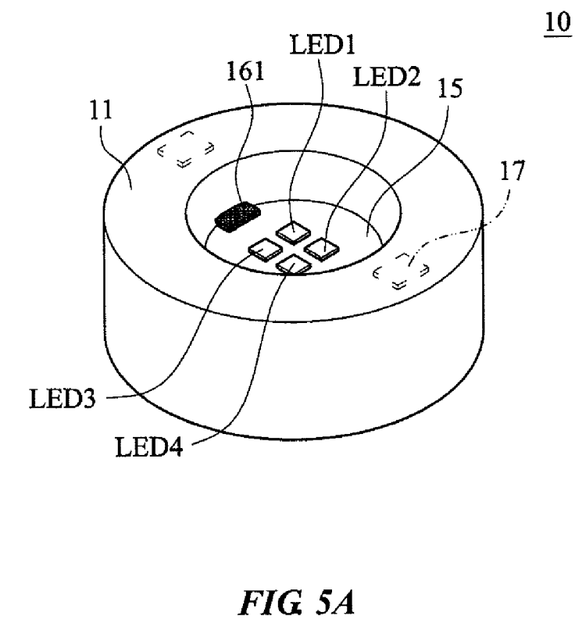
FIG. 5A is a schematic perspective view of an LED base structure equipped with an embedded capacitor and coupled to LEDs according to an embodiment of the present invention.
Figure 5B:
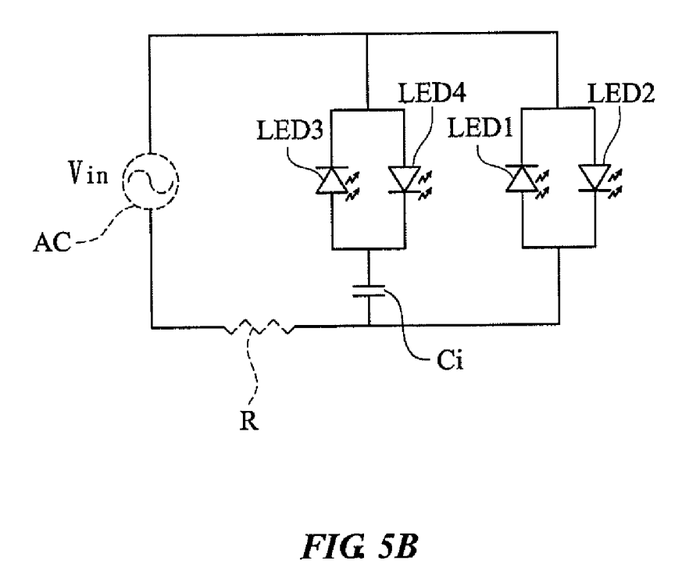
FIG. 5B is an equivalent circuit diagram of the circuit structure shown in FIG. 5A.

Referring to FIG. 5A and FIG. 5B, with four light-emitting diodes LED1, LED-2, LED3, LED-4 being die-bonded to the LED base structure 10 with the embedded capacitor Ci, four said light-emitting diodes LED1, LED-2, LED3, LED-4 are received in the recess 15 of the body 11 and form two parallel-connected groups of LEDs. Each group of LEDs comprises the forward-conducting light-emitting diodes LED1, LED3 and the reverse-conducting light-emitting diodes LED-2, LED-4.

In the situation where AC power is supplied, the light-emitting diodes LED3, LED4 are electrically connected to the first end portions 161 of one of the electrodes 16. The second end portions 162 of one of the electrodes 16 are electrically connected to one of the metal layers 12 of the embedded capacitor Ci via one of the conductive channels 14. In so doing, the light-emitting diodes LED3, LED4 are electrically connected to the embedded capacitor Ci. The light-emitting diodes LED1, LED2 are not electrically connected to the embedded capacitor Ci.

The embedded capacitor Ci and a resistor R are coupled together to form a resistor R-capacitor delay circuit. Capacitance of the embedded capacitor Ci can be regulated and controlled according to the distance between the metal layers 12 and the area thereof. Hence, capacitance of the embedded capacitor Ci can be regulated and controlled by the resistor R-capacitor delay circuit so as to produce different delay phases, such as 45° or 90°.

Figure 5C:
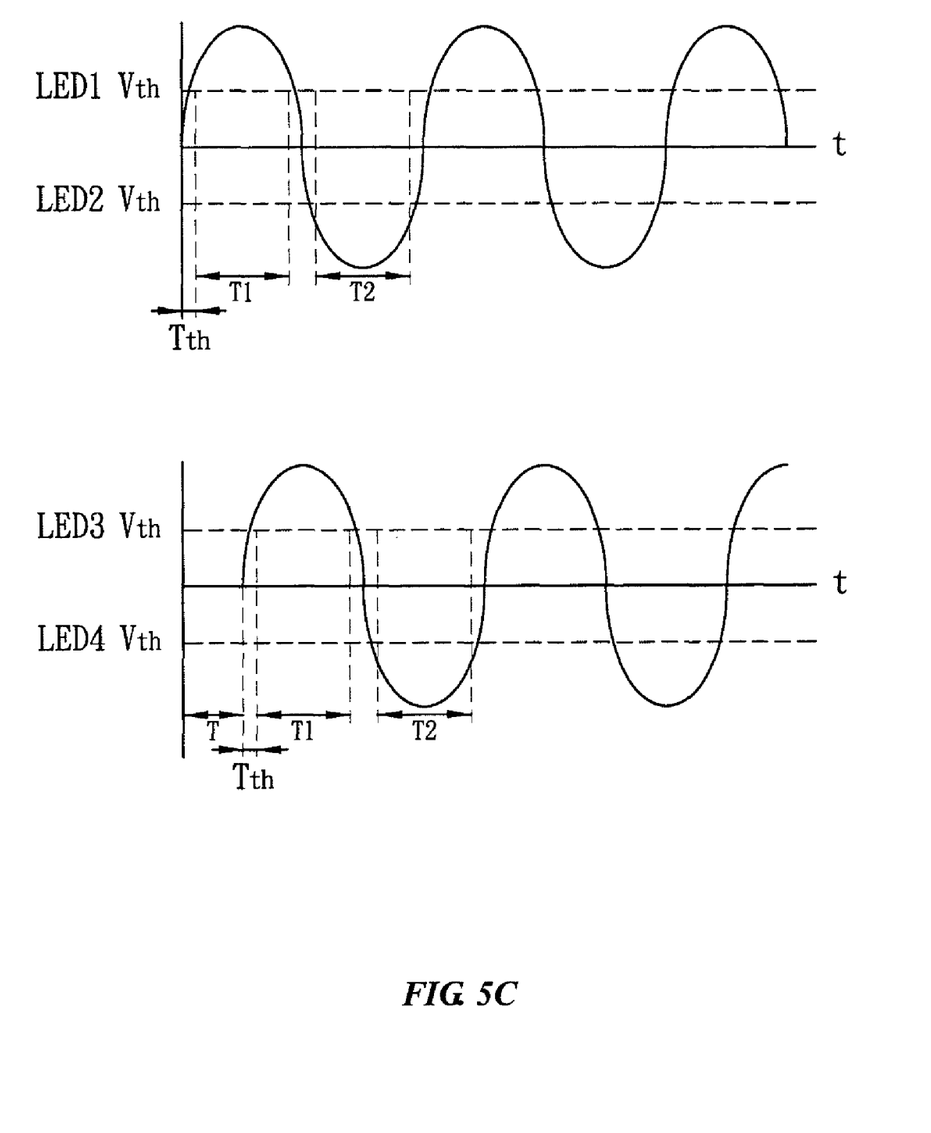
FIG. 5C is a graph of threshold voltage against AC power when AC power is supplied to the circuit structure shown in FIG. 5B.

As shown in FIG. 5C, with AC power being supplied to the LED base structure 10 with the embedded capacitor Ci, two said light-emitting diodes LED1, LED-2 not connected to the resistor-capacitor delay circuit have light emission periods T1, T2. By contrast, two said light-emitting diodes LED3, LED-4 connected to the resistor-capacitor delay circuit in series have light emission periods T3, T4, because it takes a delay time T for two said light-emitting diodes LED3, LED-4 to be rendered electrically conductive in order to emit light.

Figure 5D:
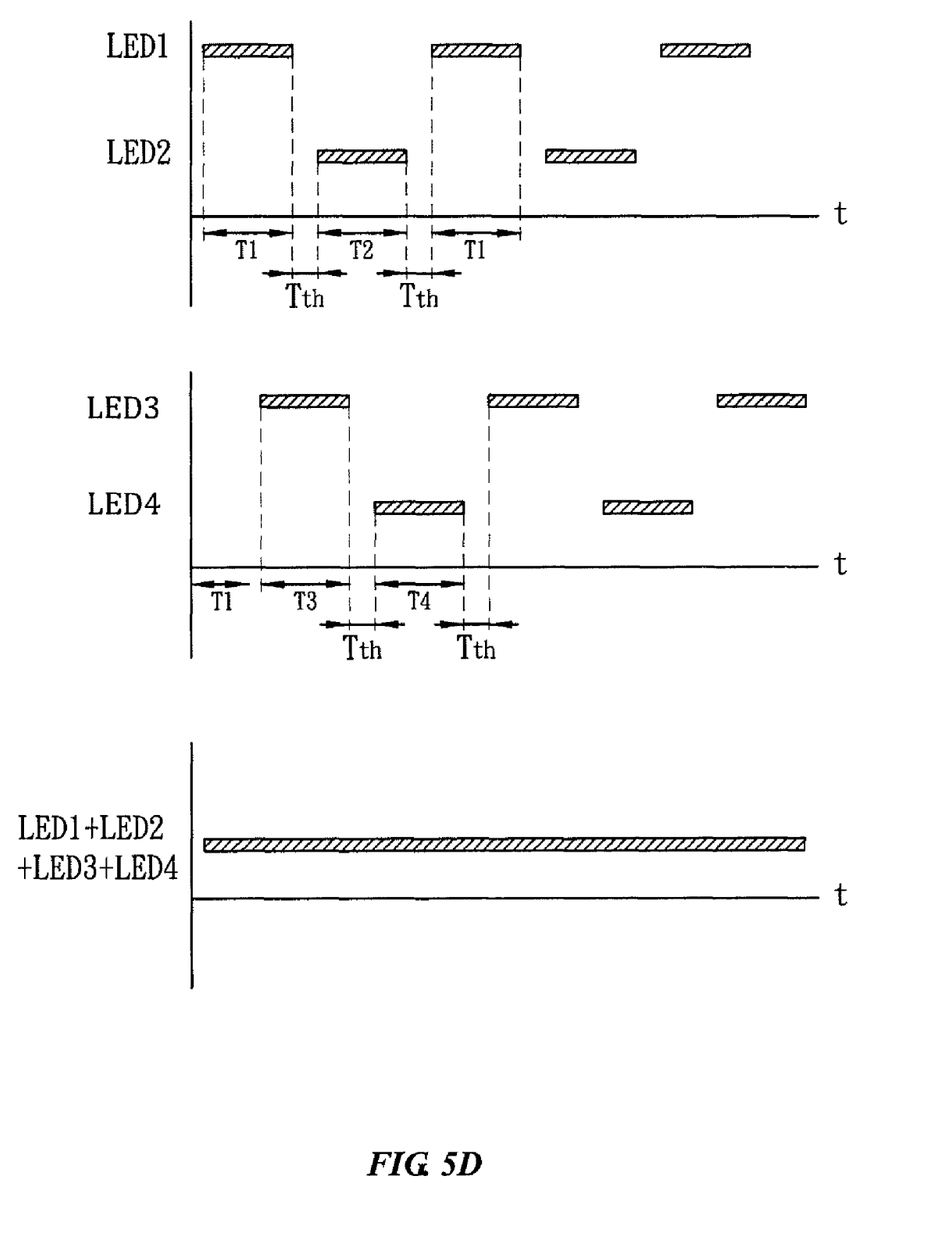
FIG. 5D is a sequence diagram of light emitted from an LED when AC power is supplied to the circuit structure shown in FIG. 5B.

Referring to FIG. 5D, due to the coordinated timing of the light emission periods T1, T2 of the light-emitting diodes LED1, LED-2 and the light emission periods T3, T4 of the light-emitting diodes LED3, LED-4, the collective light-emitting diodes of LED1, LED-2, LED3, LED-4 are consistently ON. It is because even if one of the light-emitting diodes LED1, LED-2, LED3, LED-4 falls within the waiting period Tth, the remaining ones of the light-emitting diodes LED1, LED-2, LED3, LED-4 would still continue to give off light. Therefore, by coupling the light-emitting diodes LED1, LED-2, LED3, LED-4 and the LED base structure 10 with the embedded capacitor Ci together, the known problem with the flashing phenomenon associated with AC power can be solved.

The foregoing preferred embodiments are provided to illustrate the present invention but are not intended to restrict the present invention in whatever way. Although the present invention is disclosed by means of the preferred embodiments, the preferred embodiments are not intended to limit the present invention. Persons skilled in the art can put forth equivalent embodiments by making slight changes or modifications to the aforesaid technical disclosure in the present invention without departing from technical solutions disclosed therein. All simple changes, equivalent variations, and modifications made to the foregoing embodiments according to the technical essence of the present invention and without departing from the contents of the technical solutions disclosed in the present invention should fall within the scope of the present invention as set forth in the appended claims.

What is claimed is:

1. An LED base structure with an embedded capacitor, comprising:
   a body being an insulating base, wherein the body has a recess;
   at least one pair of metal layers disposed in the body;
   at least one dielectric layer disposed between said pair of metal layers;
   at least two conductive channels electrically connected to the metal layers, respectively;

at least one pair of electrodes each having a first end portion exposed from a bottom side of the recess and a second end portion embedded in the body; and at least one pair of external electrodes disposed on a top surface of the body, respectively;

wherein one of the conductive channels is electrically connected between the second end portion of one of the electrodes and one of the metal layers; the other one of the conductive channels is electrically connected between one of the external electrodes and the other one of the metal layers; and the other one of the external electrodes is electrically connected to the second end portion of the other one of the electrodes.

2. The LED base structure with an embedded capacitor of claim 1, wherein the body comprises a plurality of ceramic layers stacked up.

3. The LED base structure with an embedded capacitor of claim 1, wherein the body is made of one of aluminum monoxide, quartz, silicon dioxide, calcium zirconate, and glass ceramic.

4. The LED base structure with an embedded capacitor of claim 1, wherein the dielectric layer is made of one of silicon dioxide, barium titanate, and a ceramic layer.

* * * * *